United States Patent
Sun et al.

(10) Patent No.: US 9,712,774 B1
(45) Date of Patent: Jul. 18, 2017

(54) METHOD AND SYSTEM FOR IMPLEMENTING DYNAMIC GROUND SHARING IN AN IMAGE SENSOR WITH PIPELINE ARCHITECTURE

(71) Applicant: OMNIVISION TECHNOLOGIES, INC., Santa Clara, CA (US)

(72) Inventors: Tianjia Sun, San Jose, CA (US); Qingfei Chen, Santa Clara, CA (US); Chun-Ming Tang, San Jose, CA (US); Jingyi Liu, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/996,141

(22) Filed: Jan. 14, 2016

(51) Int. Cl.
*H04N 5/378* (2011.01)
*H04N 5/374* (2011.01)
(Continued)

(52) U.S. Cl.
CPC .............. *H04N 5/378* (2013.01); *G06T 1/20* (2013.01); *H01L 27/14641* (2013.01); *H01L 27/14643* (2013.01); *H04N 5/3658* (2013.01); *H04N 5/374* (2013.01); *H04N 5/37455* (2013.01); *H04N 5/363* (2013.01)

(58) Field of Classification Search
CPC .... H04N 5/378; H04N 5/374; H04N 5/37455; H04N 5/357; H04N 5/3698; H04N 5/335; H04N 5/3745; H04N 5/376; H04N 5/3741; H04N 5/3765; H04N 5/363; H04N 5/3658; H03M 1/56; H03M 1/08; H03M 1/122;
(Continued)

(56) References Cited

U.S. PATENT DOCUMENTS 7,791,661 B2  9/2010  Feng et al.
7,884,872 B2 *  2/2011  Hasuka ................ H04N 3/1568
                                                        348/313

(Continued)

OTHER PUBLICATIONS

Liu, "CMOS Image Sensors Dynamic Range and SNR Enhancement Via Statistical Signal Processing," A Dissertation Submitted to the Department of Electrical Engineering—Stanford University, 139 pages (2002).

(Continued)

*Primary Examiner* — Michael Osinski
(74) *Attorney, Agent, or Firm* — Blakely Sokoloff Taylor & Zafman LLP

(57) ABSTRACT

A method of implementing dynamic ground sharing in an image sensor with pipeline architecture starts with a pixel array capturing image data. Pixel array includes pixels to generate pixel data signals, respectively. A readout circuitry acquires the image data from a row in the pixel array. An analog-to-digital conversion (ADC) circuitry included in the readout circuitry samples the image data from the row to obtain sampled input data. When the ADC circuitry is sampling, a ground sharing switch is closed to couple the pixel array and the ADC circuitry to a common ground. When the ADC circuitry is not sampling, the ground sharing switch is open to separate the pixel array and the ADC circuitry from the common ground. The ADC circuitry converts the sampled image data from analog to digital to obtain an ADC output. Other embodiments are described.

20 Claims, 3 Drawing Sheets

(51) Int. Cl.
*G06T 1/20* (2006.01)
*H01L 27/146* (2006.01)
*H04N 5/363* (2011.01)
*H04N 5/365* (2011.01)
*H04N 5/3745* (2011.01)

(58) Field of Classification Search
CPC .......... H03M 1/123; H03M 1/46; G06T 1/20; H01L 27/14643; H01L 27/14641
See application file for complete search history.

(56) References Cited

U.S. PATENT DOCUMENTS

| | | | | |
|---|---|---|---|---|
| 8,130,303 B2* | 3/2012 | Kondo | ................ | H04N 5/3575 348/301 |
| 8,410,961 B2* | 4/2013 | Iwabuchi | ................ | H03M 1/08 341/122 |
| 9,258,503 B2* | 2/2016 | Tokunaga | ................ | H04N 5/378 |
| 9,374,527 B2* | 6/2016 | Yang | ................ | H04N 5/23229 |
| 2007/0252744 A1* | 11/2007 | Takeuchi | ............ | H03M 1/1076 341/155 |
| 2008/0158401 A1* | 7/2008 | Ishimoto | ................ | H04N 3/155 348/308 |
| 2010/0182472 A1* | 7/2010 | Yamagata | ......... | H04N 5/3658 348/302 |
| 2010/0231574 A1* | 9/2010 | Wakabayashi | ......... | H04N 5/357 345/211 |
| 2012/0175500 A1* | 7/2012 | Saito | ...................... | H04N 5/378 250/208.1 |
| 2012/0274823 A1* | 11/2012 | Matsuda | ............... | H04N 5/3532 348/302 |
| 2013/0070133 A1* | 3/2013 | Takazawa | ............... | H04N 5/335 348/294 |
| 2013/0201361 A1* | 8/2013 | Yang | ................... | H04N 5/23229 348/222.1 |
| 2015/0249801 A1* | 9/2015 | Tokunaga | ............... | H04N 5/378 341/155 |
| 2015/0303937 A1* | 10/2015 | Gou | ........................ | H04N 5/378 250/208.1 |
| 2016/0014353 A1* | 1/2016 | Lee | ........................ | H04N 5/347 250/208.1 |
| 2016/0150172 A1* | 5/2016 | Okamoto | ............. | H04N 5/3698 348/322 |
| 2016/0156860 A1* | 6/2016 | Sakai | .................... | H04N 5/3765 348/281 |
| 2016/0261817 A1* | 9/2016 | Totsuka | ................. | H04N 5/363 |
| 2016/0286144 A1* | 9/2016 | Yanai | ................. | H04N 5/37455 |
| 2016/0286152 A1* | 9/2016 | Kobayashi | ............. | H04N 5/378 |

OTHER PUBLICATIONS

Takayanagi et al., "A 1.25-inch 60-Frames/s 8.3-M-Pixel Digital-Output CMOS Image Sensor," IEEE Journal of Solid-State Circuits, vol. 40, No. 11, pp. 2305-2314 (2005).

Seo et al., "A Low-Noise High Intrascene Dynamic Range CMOS Image Sensor With a 13 to 19b Variable-Resolution Column-Parallel Folding-Integration/Cyclic ADC," IEEE Journal of Solid-State Circuits, vol. 47, No. 1, pp. 272-283 (2012).

* cited by examiner

METHOD AND SYSTEM FOR IMPLEMENTING DYNAMIC GROUND SHARING IN AN IMAGE SENSOR WITH PIPELINE ARCHITECTURE

FIELD

An example of the present invention relates generally to image sensors with pipeline architecture. More specifically, examples of the present invention are related to methods and systems for implementing dynamic ground sharing in an image sensor with pipeline architecture.

BACKGROUND

High-speed image sensors have been widely used in many applications in different fields including the automotive field, the machine vision field, and the field of professional video photography. The development of high speed image sensors is further driven by the consumer market's continued demand for high speed slow motion video and normal high-definition (HD) video that have a reduced rolling shutter effect.

In addition to the frame rate and power consumption demands, image sensors are also subjected to performance demands. The quality and accuracy of the pixel readouts cannot be compromised to accommodate the increase in frame rate or power consumption.

In order to increase the frame rate, pipeline architectures have been implemented in high-speed image sensors that allow for multiple workflows to be occurring in a high-speed image sensor. However, electrical interference from the different elements in the high-speed image sensor may degrade the image quality being generated by the image sensor.

BRIEF DESCRIPTION OF THE DRAWINGS

The embodiments of the invention are illustrated by way of example and not by way of limitation in the figures of the accompanying drawings in which like references indicate similar elements throughout the various views unless otherwise specified. It should be noted that references to "an" or "one" embodiment of the invention in this disclosure are not necessarily to the same embodiment, and they mean at least one. In the drawings.

Figure 1:
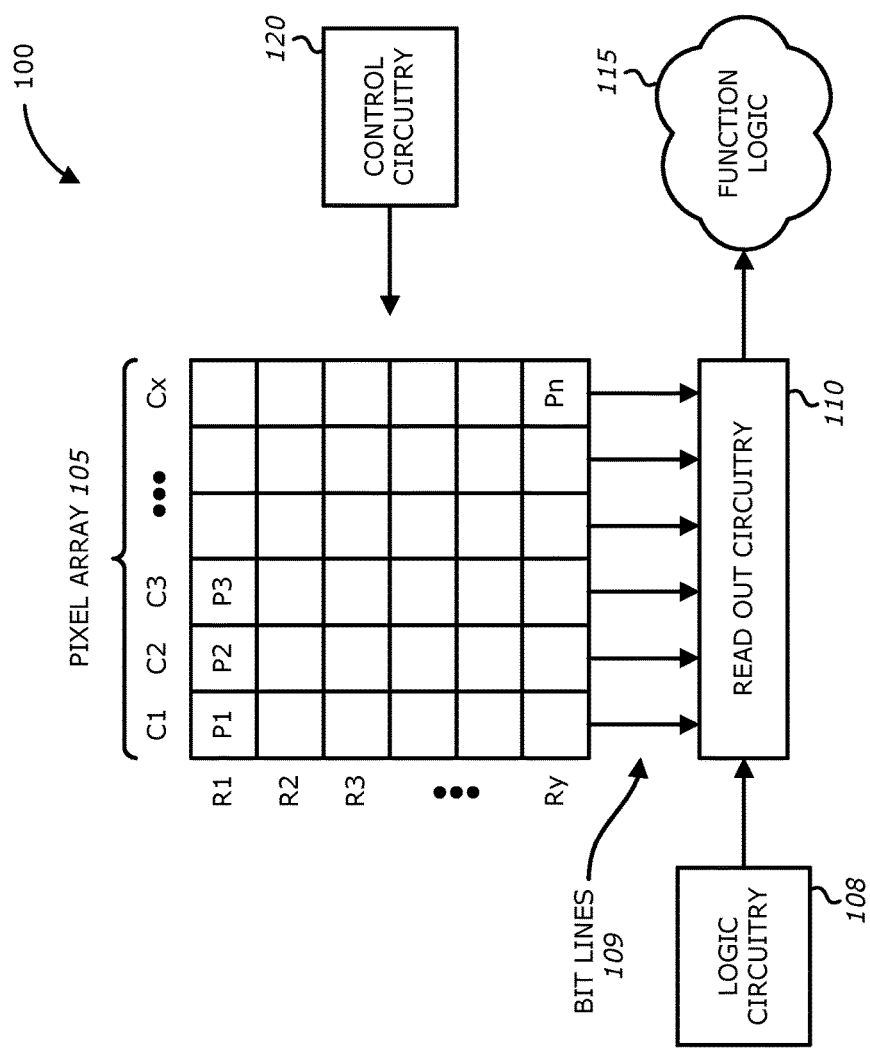
FIG. 1 is a block diagram illustrating an example imaging system with pipeline architecture that implements dynamic ground sharing in accordance to one embodiment of the invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exagerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. However, it is understood that embodiments of the invention may be practiced without these specific details. In other instances, well-known circuits, structures, and techniques have not been shown to avoid obscuring the understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Particular features, structures or characteristics may be included in an integrated circuit, an electronic circuit, a combinatorial logic circuit, or other suitable components that provide the described functionality.

Examples in accordance with the teaching of the present invention describe an image sensor with pipeline architecture that implements dynamic ground sharing. In pipeline architecture, two or more workflows may be occurring at the same time in one image sensor. Accordingly, while a first row (e.g., current row) of pixels is reset, transferred, sampled, etc., a second row (e.g., previous row) of pixels are converted by an analog-to-digital conversion (ADC) circuitry. In this example, the first row is subsequent to the second row in a pixel array. In some embodiments, a ground sharing switch is closed to couple pixel array and ADC circuitry to a common ground when ADC is sampling, and is open to separate pixel array and ADC circuitry from the common ground when the ADC circuitry is not sampling. There is an electrical interference from pixel actions to ADC circuitry. This may be caused by pixel array and ADC circuitry sharing the same analog ground (e.g. common ground). However, when ADC circuitry samples, it is preferred to have pixel array and ADC circuitry sharing the same ground, otherwise, additional noise will be generated. Accordingly, the electrical interference from pixel actions to ADC circuitry that is caused by pixel array and ADC circuitry sharing the same common ground is reduced.

FIG. 1 is a block diagram illustrating an example imaging system 100 with pipeline architecture that implements dynamic ground sharing in accordance to one embodiment of the invention. Imaging system 100 may be a complementary metal-oxide-semiconductor ("CMOS") image sensor. As shown in the depicted example, imaging system 100 includes pixel array 105 coupled to control circuitry 120 and readout circuitry 110, which is coupled to function logic 115 and logic control 108.

The illustrated embodiment of pixel array 105 is a two-dimensional ("2D") array of imaging sensors or pixel cells (e.g., pixel cells P1, P2, . . . , Pn) that generate pixel data signals, respectively. In one example, each pixel cell is a CMOS imaging pixel. As illustrated, each pixel cell is arranged into a row (e.g., rows R1 to Ry) and a column (e.g., columns C1 to Cx) to acquire image data of a person, place or object, etc., which can then be used to render an image of the person, place or object, etc. Pixel array 105 may includes visible pixels and optical black pixels (OPB). The visible pixels convert the light incident to the pixel to an electrical signal (e.g., a visible signal) and output the visible signal whereas the OPB output a dark signal. In one embodiment, pixel array 105 captures image data, which may include resetting pixels in pixel array 105, pre-charging pixels in pixel array 105, and transferring the pixel data signals to readout circuitry 110.

In one example, after each pixel has acquired its image data or image charge, the image data is read out by readout circuitry 110 through readout column bit lines 109 and then transferred to function logic 115. In one embodiment, a logic circuitry 108 can control readout circuitry 110 and output image data to function logic 115. In various examples, readout circuitry 110 may include amplification circuitry (not illustrated), analog-to-digital conversion (ADC) circuitry 220, or otherwise. Function logic 115 may simply store the image data or even manipulate the image data by applying post image effects (e.g., crop, rotate, remove red eye, adjust brightness, adjust contrast, or otherwise). In one example, readout circuitry 110 may read out a row of image data at a time along readout column lines (illustrated) or may read out the image data using a variety of other techniques (not illustrated), such as a serial read out or a full parallel read out of all pixels simultaneously.

In one example, control circuitry 120 is coupled to pixel array 105 to control operational characteristics of pixel array 105. For example, control circuitry 120 may generate a shutter signal for controlling image acquisition. In one example, the shutter signal is a global shutter signal for simultaneously enabling all pixels within pixel array 105 to simultaneously capture their respective image data during a single acquisition window. In another example, the shutter signal is a rolling shutter signal such that each row, column, or group of pixels is sequentially enabled during consecutive acquisition windows.

Figure 2:
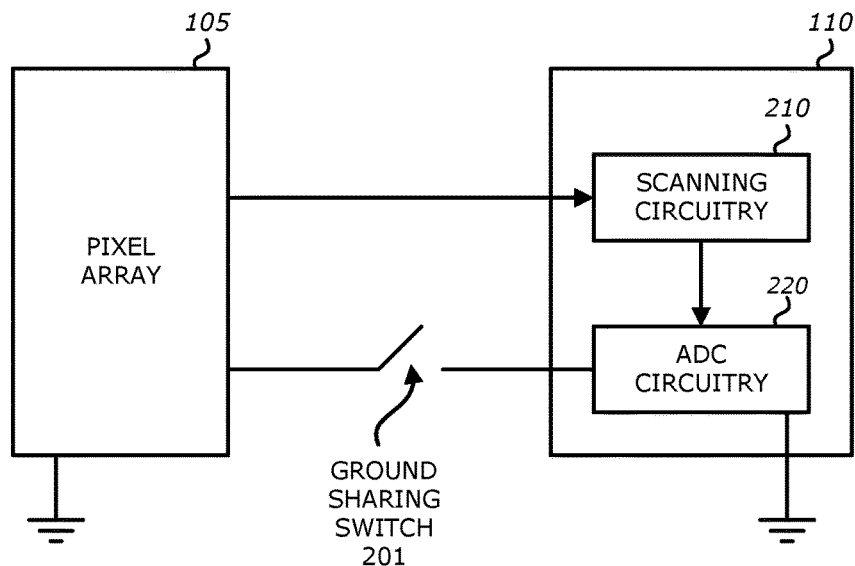
FIG. 2 is a block diagram illustrating the details of pixel array and readout circuitry of imaging system in FIG. 1 that implements dynamic ground sharing in accordance to one embodiment of the invention

FIG. 2 is a block diagram illustrating the details of pixel array 105 and readout circuitry 120 of imaging system 100 in FIG. 1 that implements dynamic ground sharing in accordance to one embodiment of the invention. In some embodiments, readout circuitry 110 implements correlated double-sampling (CDS). As shown in FIG. 2, the readout circuitry 110 may include scanning circuit 210 and an ADC circuitry 220. Scanning circuitry 210 may include amplification circuitry, selection circuitry (e.g., multiplexers), etc. to readout a row of image data at a time along readout column bit lines 109 or may readout the image data using a variety of other techniques, such as a serial readout or a full parallel readout of all pixels simultaneously.

In one embodiment, scanning circuitry 210 selects and amplifies image data from the row and transmitting the image data from the row to ADC circuitry 220. ADC circuitry 220 may receive the image data from a row in the pixel array from scanning circuitry 210 or from pixel array 105. While not illustrated, in some embodiments, ADC circuitry 220 may include a plurality of ADC circuits. ADC circuits may be a type of column ADC (e.g., SAR, cyclic, etc.). ADC circuits may be similar for each column of pixel array 105. ADC circuitry 220 may sample image data from a row of pixel array 105 to obtain a sampled input data. ADC circuitry 220 may convert the sampled input data from analog to digital to obtain an ADC output.

As shown in FIG. 2, a ground sharing switch 201 couples or separates pixel array 105 and ADC circuitry 220 to a common ground. In one embodiment, ground sharing switch 201 is closed to couple pixel array 105 and ADC circuitry 220 to a common ground when ADC circuitry 220 is sampling, and is open to separate pixel array 105 and ADC circuitry 220 from the common ground when ADC circuitry 220 is not sampling. For example, while ADC circuitry 220 is not sampling, ground sharing switch 201 may be open when pixel array 105 captures the image data or when ADC circuitry 220 converts the sampled image data.

The electrical interference from pixel actions by pixel array 105 to ADC circuitry 220 may be caused by pixel array 105 and ADC circuitry 220 sharing the same common ground. However, when ADC circuitry 220 samples, it is preferred to have pixel array 105 and ADC circuitry 220 sharing the same ground, because, otherwise, additional noise will be generated. Accordingly, the electrical interference from pixel actions to ADC circuitry 220 that is caused by pixel array 105 and ADC circuitry 220 sharing the same common ground is reduced.

Figure 3:
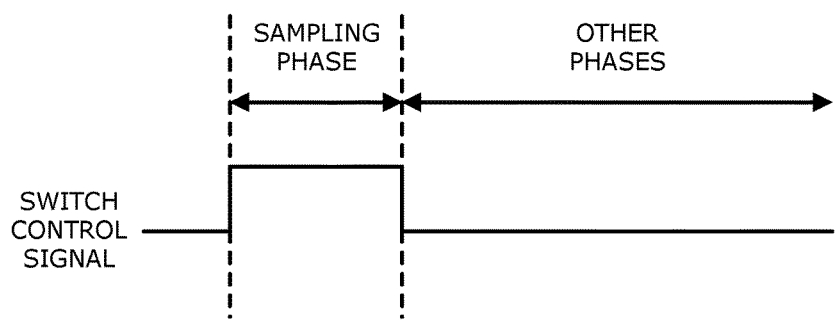
FIG. 3 is a timing diagram illustrating an exemplary switch timing signal in accordance to one embodiment of the invention.

In one embodiment, logic circuitry 108 or control circuitry 120 may control ground sharing switch 201. For instance, logic circuitry 108 or control circuitry 120 may generate a switch timing signal that controls the opening and closing of ground sharing switch 201. FIG. 3 is a timing diagram illustrating an exemplary switch timing signal in accordance to one embodiment of the invention. As shown in FIG. 3, switch timing signal may be set to '1' to signal the closing of ground sharing switch 201 when ADC circuitry 220 is sampling, and switch timing signal may be set to '0' to signal the opening of ground sharing switch 201 when ADC circuitry 220 is not sampling. In pipeline architecture, two or more workflows may be occurring at the same time in one image sensor 100. Accordingly, while a first row (e.g., current row) of pixels is reset, transferred, sampled, etc., a second row (e.g., previous row) of pixels is converted by ADC circuitry 220. In this example, the first row is subsequent to the second row in a pixel array. Thus, the switch ground sharing switch 201 to close in order to couple pixel array 105 and ADC circuitry 220 to a common ground when ADC circuitry 220 is sampling the current row of pixels in pixel array 105 while ADC circuitry 220 is converting a previous row of pixels in pixel array 105.

Accordingly, the electrical interference from pixel actions to ADC circuitry 220 that is caused by pixel array 105 and ADC circuitry 220 sharing the same analog ground (e.g., common ground) is reduced using the ground sharing switch 201. In one embodiment, the common ground is included on a printed circuit board (PCB).

In one embodiment, ADC circuitry 220 includes a digital-to-analog (DAC) circuitry and a Successive Approximation Register (SAR). DAC circuitry may be a capacitor-implemented DAC or may be implemented using resistors or a hybrid of resistors and capacitors. In this embodiment, the image data from the row on DAC circuitry is sampled against an ADC pedestal stored in SAR to obtain the sampled input data. ADC circuitry 220 then converts the sampled input data from analog to digital to obtain ADC output value by performing a binary search using DAC circuitry and SAR (not shown). SAR may be is reset before each conversion of sampled input data. The sampled input data is obtained by ADC circuitry 220 sampling the image data from a given row that is being processed.

In another embodiment, ADC circuitry 220 includes a comparator and an ADC counter (not shown). In this embodiment, ADC circuitry 220 converting the sampled input data from analog to digital includes comparator, such as a fully differential op, comparing the sampled input data to a ramp signal to generate a comparator output signal, and ADC counter counting based on the comparator output signal to generate the ADC output. In one embodiment, ramp signal is generated a ramp generator included in readout circuitry 110 or logic circuitry 108. In one embodiment, logic circuitry 108 includes a phased locked loop (PLL) to generate an ADC clock signal that is transmitted to ramp generator. In this embodiment, ramp generator generates a ramp signal that is synchronized to the ADC clock signal.

SAR in conjunction with DAC circuitry perform a binary search and each bit in data output lines of DAC circuitry is set in succession from the most significant bit (MSB) to least significant bit (LSB). In one embodiment, comparator determines whether a bit in data output lines of DAC circuitry should remain set or be reset. At the end of the conversion, SAR holds a conversion of the sampled input data (e.g., ADC output). In some embodiments, function logic 115 receives and processes ADC outputs from ADC circuitry 220 to generate a final ADC output.

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 4:
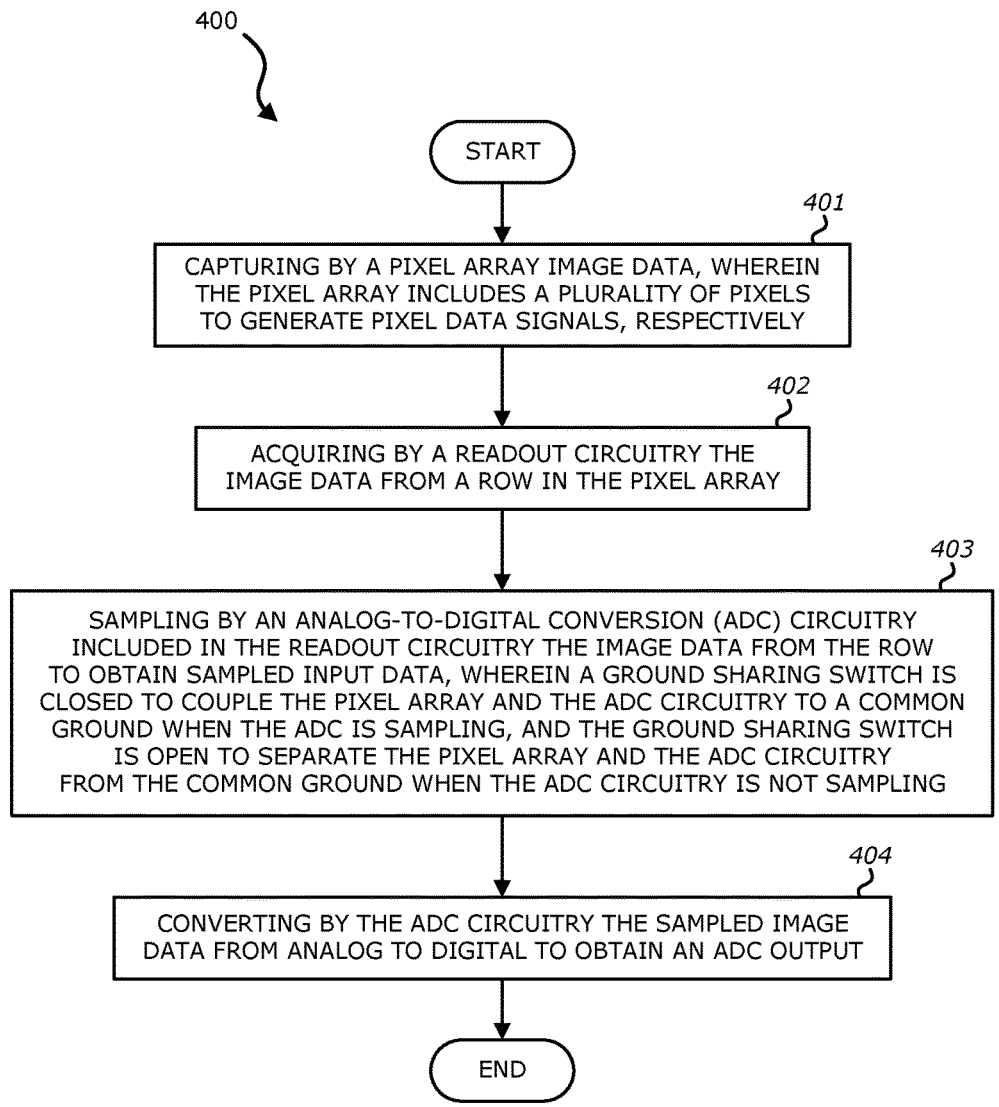
FIG. 4 is a flowchart illustrating a method for implementing dynamic ground sharing in an image sensor with pipeline architecture in accordance to one embodiment of the invention.

FIG. 4 is a flowchart illustrating a method 400 for implementing dynamic ground sharing in an image sensor 100 with pipeline architecture in accordance to one embodiment of the invention. Method 400 starts with a pixel array 105 capturing image data. Pixel array 105 includes pixels to generate pixel data signals, respectively (Block 401). In some embodiments, pixel array 105 capturing the image data includes resetting the plurality of pixels the row of pixel array 105, pre-charging the plurality of pixels in the row of pixel array 105, and transferring the pixel data signals from pixel array 105 to readout circuitry 110.

At Block 402, a readout circuitry 110 acquires the image data from a row in pixel array 105. In one embodiment, readout circuitry 110 acquires the image data from the row by selecting and amplifying the image data from the row and transmitting the image data from the row to ADC circuitry 220.

At Block 403, an ADC circuitry 220 included in readout circuitry 110 samples the image data from the row to obtain sampled input data. In one embodiment, a ground sharing switch 201 is closed to couple pixel array 105 and ADC circuitry 220 to a common ground when ADC circuitry 220 is sampling, and ground sharing switch 201 is open to separate pixel array 105 and ADC circuitry 220 from the common ground when the ADC circuitry 220 is not sampling. In one embodiment, the common ground is included on a printed circuit board (PCB). In this embodiment, PCB may be included in image sensor 100. In one embodiment, at least one of logic circuitry 108 or control circuitry 230 controls ground sharing switch 201 by generating and transmitting a switch timing signal. At Block 404, ADC circuitry 220 converts the sampled image data from analog to digital to obtain an ADC output. In some embodiments, function logic 115 receives and processes ADC outputs from ADC circuitry 220 to generate a final ADC output.

In one embodiment, sampling by ADC circuitry 220 the image data from the row to obtain the sampled input data includes sampling the image data from the row on a DAC circuitry included in the ADC circuitry 220 against an ADC pedestal stored in a SAR to obtain the sampled input data. In this embodiment, converting by ADC circuitry 220 the sampled input data from analog to digital to obtain the ADC output value includes performing a binary search using DAC circuitry and SAR.

In another embodiment, converting by ADC circuitry 220 the sampled input data from analog to digital to obtain the ADC output value includes comparing by a comparator included in ADC circuitry 220 the sampled input data to a ramp signal to generate a comparator output signal, and counting by an ADC counter based on the comparator output signal to generate an ADC output.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method of implementing dynamic ground sharing in an image sensor with pipeline architecture comprising:
   capturing, by a pixel array, image data wherein the pixel array includes a plurality of pixels to generate pixel data signals, respectively;
   acquiring, by readout circuitry, the image data from a row in the pixel array;
   sampling, by analog-to-digital conversion (ADC) circuitry included in the readout circuitry, the image data from the row to obtain sampled input data, wherein
   a ground sharing switch is closed to couple the pixel array and the ADC circuitry to a common ground when the ADC circuitry is sampling the image data, and
   the ground sharing switch is open to separate the pixel array and the ADC circuitry from the common ground when the ADC circuitry is not sampling the image data; and
   converting, by the ADC circuitry, the sampled image data from analog data to digital data to obtain ADC output data.

2. The method of claim 1, wherein the common ground is included on a printed circuit board (PCB).

3. The method of claim 1, wherein the ground sharing switch is open when the pixel array captures the image data or when the ADC circuitry coverts the sampled image data.

4. The method of claim 1, wherein capturing, by the pixel array, the image data includes resetting the plurality of pixels, pre-charging the plurality of pixels, and transferring the pixel data signals to the readout circuitry.

5. The method of claim 1, further comprising:
controlling, by at least one of logic circuitry or control circuitry, the ground sharing switch.

6. The method of claim 1, wherein acquiring, by the readout circuitry, the image data from the row further comprises:
selecting and amplifying, by scanning circuitry included in the readout circuitry, the image data from the row; and
transmitting the image data from the row to the ADC circuitry.

7. The method of claim 1, wherein sampling, by the ADC circuitry, the image data from the row to obtain the sampled input data further comprises:
sampling the image data from the row by digital-to-analog (DAC) circuitry included in the ADC circuitry against an ADC pedestal stored in a Successive Approximation Register (SAR) to obtain the sampled input data.

8. The method of claim 7, wherein converting, by the ADC circuitry, the sampled input data from analog data to digital data to obtain the ADC output data includes:
performing a binary search using the DAC circuitry and the SAR.

9. The method of claim 1, wherein converting, by the ADC circuitry, the sampled input data from analog data to digital data to obtain the ADC output data includes:
comparing, by a comparator included in the ADC circuitry, the sampled input data to a ramp signal to generate a comparator output signal, and
counting, by an ADC counter, based on the comparator output signal to generate the ADC output data.

10. An image sensor with pipeline architecture implementing dynamic ground sharing comprising:
a pixel array for capturing image data of a frame, wherein the pixel array includes a plurality of pixels to generate pixel data signals, respectively; and
readout circuitry coupled to the pixel array to acquire the image data from a row in the pixel array, wherein the readout circuitry includes:
analog-to-digital conversion (ADC) circuitry to sample the image data from the row to obtain sampled input data and to convert the sampled input data from analog data to digital data to obtain ADC output data;
a ground sharing switch that couples or separates the pixel array and the ADC circuitry to a common ground, wherein the ground sharing switch is dynamically controlled (i) to close to couple the pixel array and the ADC circuitry to a common ground when the ADC circuitry is sampling the image data and (ii) to open to separate the pixel array and the ADC circuitry from the common ground when the ADC circuitry is not sampling the image data.

11. The image sensor of claim 10, further comprising:
control circuitry to control operational characteristics of the pixel array; and
logic circuitry to control the readout circuitry,
wherein at least one of the logic circuitry or the control circuitry dynamically controls the ground sharing switch.

12. The image sensor of claim 10, wherein the common ground is included on a printed circuit board (PCB).

13. The image sensor of claim 10, wherein the ground sharing switch is open when the pixel array captures the image data or when the ADC circuitry converts the sampled image data.

14. The image sensor of claim 10, wherein the pixel array capturing the image data includes resetting the plurality of pixels, pre-charging the plurality of pixels, and transferring the pixel data signals.

15. The image sensor of claim 10, wherein the readout circuitry further comprises:
scanning circuitry to select and amplify the image data from the row, and to transmit the image data from the row to the ADC circuitry.

16. The image sensor of claim 10, wherein the ADC circuitry further comprises:
digital-to-analog (DAC) circuitry and a Successive Approximation Register (SAR), wherein the image data from the row is sampled by the DAC circuitry against an ADC pedestal stored in the SAR to obtain the sampled input data.

17. The image sensor of claim 16, wherein the ADC circuitry converting the sampled input data from analog data to digital data includes:
performing a binary search using the DAC circuitry and the SAR.

18. The image sensor of claim 10, wherein the ADC circuitry further comprises:
a comparator to compare the sampled input data to a ramp signal to generate a comparator output signal, and
an ADC counter to count based on the comparator output signal to generate the ADC output data.

19. An image sensor with pipeline architecture implementing dynamic ground sharing comprising:
a pixel array for capturing image data of a frame, wherein the pixel array includes a plurality of pixels to generate pixel data signals, respectively; and
readout circuitry coupled to the pixel array to acquire the image data from a row in the pixel array, wherein the readout circuitry includes:
analog-to-digital conversion (ADC) circuitry to sample the image data from the row to obtain sampled input data and to convert the sampled input data from analog data to digital data to obtain ADC output data;
a ground sharing switch that couples or separates the pixel array and the ADC circuitry to a common ground, wherein the ground sharing switch is dynamically controlled (i) to close to couple the pixel array and the ADC circuitry to a common ground when the ADC circuitry is sampling the image data and (ii) to open to separate the pixel array and the ADC circuitry from the common ground when the ADC circuitry is not sampling the image data; and
control circuitry to control operational characteristics of the pixel array; and
logic circuitry to control the readout circuitry, wherein at least one of the logic circuitry or a control circuitry dynamically controls the ground sharing switch.

20. The image sensor of claim 19, wherein the image sensor with pipeline architecture simultaneously performs first and second work flows, wherein the first work flow includes the pixel array capturing an image data of a current row in the pixel array including resetting the plurality of pixels, pre-charging the plurality of pixels, and transferring the pixel data signals of the current row, and the second work flow includes the ADC circuitry converting sampled input data of a previous row in the pixel array.

* * * * *